US012694923B2

(12) United States Patent
Yin et al.

(10) Patent No.: US 12,694,923 B2
(45) Date of Patent: Jul. 28, 2026

(54) LOW-POWER OUTPUT DRIVER FOR POWER-SUPPLY TERMINATION IN MEMORY INTERFACE APPLICATIONS

(71) Applicant: RENESAS ELECTRONICS AMERICA INC., Milpitas, CA (US)

(72) Inventors: Howard Yin, Jingan District (CN); Yumin Zhang, Shanghai (CN); Yue Yu, Johns Creek, GA (US)

(73) Assignee: RENESAS ELECTRONICS AMERICA INC., Milpitas, CA (US)

( * ) Notice: Subject to any disclaimer, the term of this patent is extended or adjusted under 35 U.S.C. 154(b) by 440 days.

(21) Appl. No.: 18/252,789

(22) PCT Filed: Nov. 17, 2020

(86) PCT No.: PCT/CN2020/129348
§ 371 (c)(1),
(2) Date: May 12, 2023

(87) PCT Pub. No.: WO2022/104509
PCT Pub. Date: May 27, 2022

(65) Prior Publication Data
US 2023/0410881 A1      Dec. 21, 2023

(51) Int. Cl.
*G11C 11/4076* (2006.01)
*G11C 7/10* (2006.01)
*H03K 19/003* (2006.01)

(52) U.S. Cl.
CPC ........ *G11C 11/4076* (2013.01); *G11C 7/1051* (2013.01); *H03K 19/00384* (2013.01)

(58) Field of Classification Search
CPC ............ G11C 11/4076; G11C 11/4096; G11C 7/1051; G11C 7/1057; G11C 7/222;
(Continued)

(56) References Cited

U.S. PATENT DOCUMENTS 9,997,214 B1 * 6/2018 Kumar ................. G11C 7/1069
10,373,671 B1   8/2019 Gomm et al.
(Continued)

FOREIGN PATENT DOCUMENTS

CN    1941185 A    4/2007
CN   110800060 A    2/2020
(Continued)

OTHER PUBLICATIONS

Office Action for application KR 10-2023-7014859, dated Sep. 27, 2024, 7 pages.
(Continued)

*Primary Examiner* — Seokjin Kim
(74) *Attorney, Agent, or Firm* — Haynes and Boone LLP

(57) ABSTRACT

An output driver is disclosed that can include a delay generator configured to produce a plurality of delay signals in response to an input signal; a pre-driver configured to produce a plurality of control signals based on the plurality of shifted delay signals; and a main driver configured to couple to a channel with an asymmetric termination and provide an output signal at a node of the main driver based in response to the plurality of control signals, wherein the plurality of control signals provides for an asymmetric response in the main driver in response to the asymmetric termination. In some embodiments, an asymmetric switching sequence can be included. In some embodiments, a pull-up diode can be engaged. In some embodiments, the output driver is arranged to operate with core voltages and core transistors.

40 Claims, 8 Drawing Sheets

(58) Field of Classification Search
CPC ....... G11C 29/021; G11C 29/028; G11C 5/04;
H03K 19/00384
See application file for complete search history.

(56) References Cited

U.S. PATENT DOCUMENTS

| | | | | |
|---|---|---|---|---|
| 2006/0255829 | A1* | 11/2006 | Kim | H04L 25/028 |
| | | | | 326/30 |
| 2007/0201258 | A1* | 8/2007 | Son | G11C 7/1051 |
| | | | | 257/664 |
| 2010/0085823 | A1 | 4/2010 | Carpenter et al. | |
| 2017/0201243 | A1* | 7/2017 | Hu | G11C 7/1057 |
| 2017/0278451 | A1* | 9/2017 | Peng | G09G 3/2092 |
| 2018/0131374 | A1* | 5/2018 | Choi | H03K 19/0005 |
| 2019/0238129 | A1* | 8/2019 | Fukushima | H02M 1/08 |
| 2019/0326862 | A1 | 10/2019 | Sun et al. | |
| 2020/0089431 | A1* | 3/2020 | Jung | G11C 11/4093 |
| 2021/0409019 | A1* | 12/2021 | Lee | H03K 17/6872 |
| 2022/0188036 | A1* | 6/2022 | Akamatsu | G06F 3/0688 |

FOREIGN PATENT DOCUMENTS

| | | | | |
|---|---|---|---|---|
| DE | 102007002297 A1 * | 8/2007 | | G11C 7/10 |
| KR | 1020060039319 A | 5/2006 | | |
| KR | 1020060117170 A | 11/2006 | | |
| KR | 1020120130703 A | 12/2012 | | |

OTHER PUBLICATIONS

International Search Report and Written Opinion for PCT/CN2020/129348, dated Aug. 6, 2021, 8 pages.

\* cited by examiner

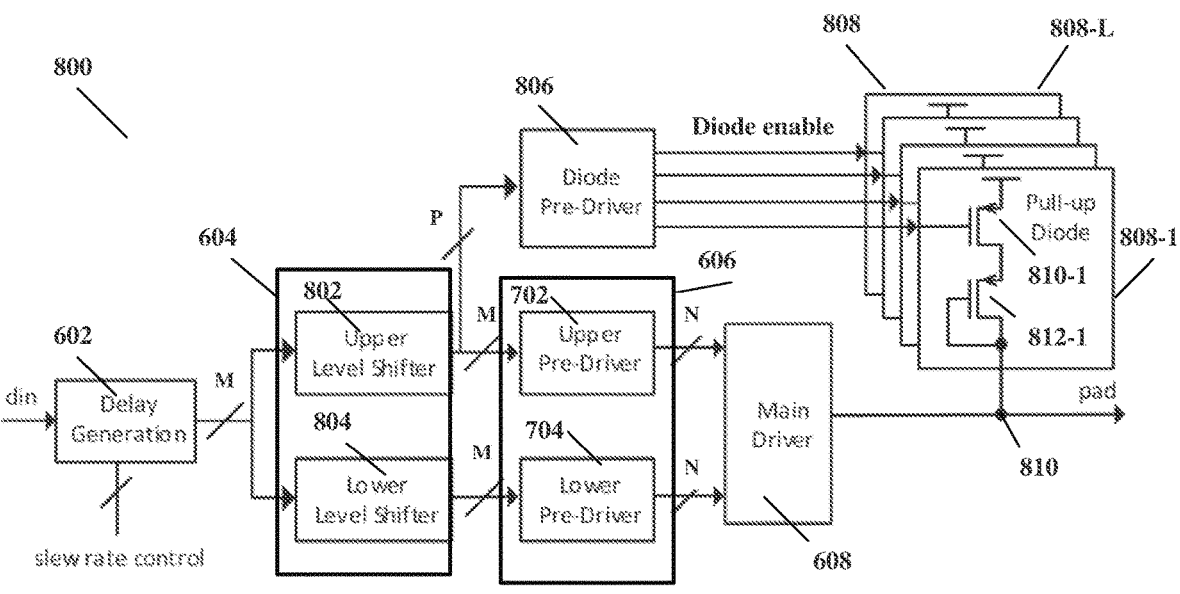
Figure 8
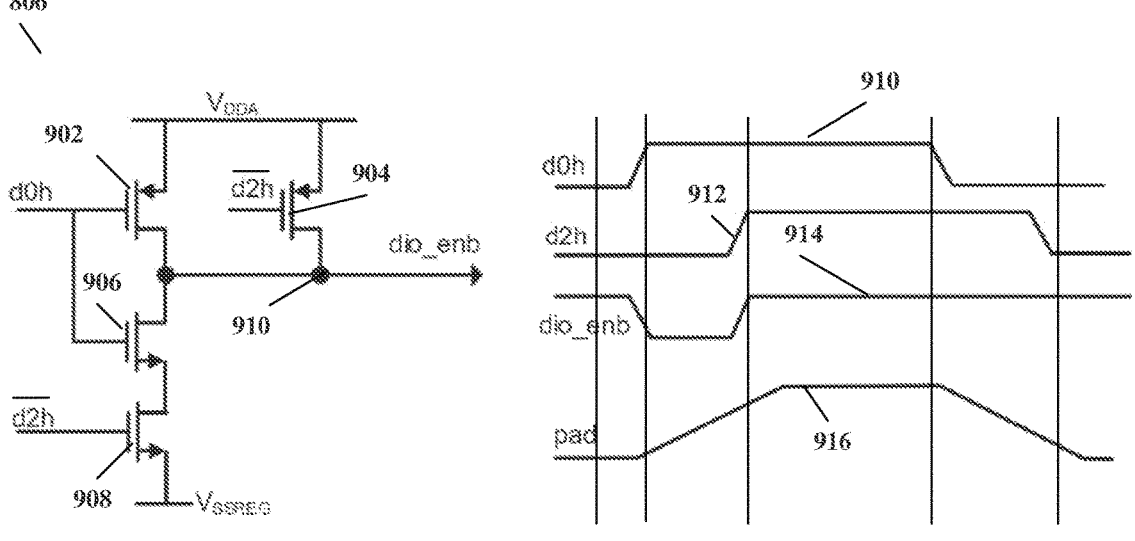
Figure 9A                              Figure 9B

LOW-POWER OUTPUT DRIVER FOR POWER-SUPPLY TERMINATION IN MEMORY INTERFACE APPLICATIONS

CROSS-REFERENCE TO RELATED APPLICATIONS

The present application is a U.S. National Stage patent application of International Patent Application No. PCT/CN2020/129348 filed Nov. 17, 2020, the benefit of which is claimed and the disclosures of which is incorporated herein by reference in its entirety.

TECHNICAL FIELD

Embodiments of the present invention are related memory and, in particular, to transmission termination in memory applications.

DISCUSSION OF RELATED ART

Random access memory (RAM) provides fast, cost-effective, volatile storage for computing devices. The Joint Electron Device Engineering Council (JEDEC) provides memory standards for storage devices. DDR4 (double data rate fourth generation) SDRAM (synchronous dynamic random-access memory) is currently deployed. DDR SDRAM provides the go-to memory system for most application because of its high-density data storage with simple capacitor-based storage elements, low latency at high performance, high endurance, and low power consumption.

DDR4 SDRAMS can provide high-density and high-performance data storage in various types and form factors. Individual DRAMs can be used in various applications or in some cases are assembled on a dual in-line memory module (DIMM), which is a printed circuit board (PCB) with several DRAM chips. DDR4 DIMMs can support 64-bit or 72-bit data widths. DDR4 SDRAM can currently operate at up to 3.2 gigabits per second. DDR4 SDRAMS have sizes of between 2 Gb and 16 Gb, operate at an I/O voltage of 1.2V.

DDR5 SDRAM is currently under development and the JEDEC DDR5 standard was released in July of 2020. DDR5 includes devices sizes of 8 Gb to 64 Gb and operates at speeds of up to 6.4 gigabits per second. The DRAM I/O voltage is reduced to 1.1V and significant changes have been made to the DIMM topology. In particular, the DIMM topology can be dual channel with each channel being either 32 bit widths or 40 bit widths.

At such high data rates, the integrity and timing onboard each DIM NI becomes more challenging and difficult. As speeds become higher, drivers that provides signals between individual components of the DIMM are switched at higher speeds. Further, rising/falling edges become sharper and larger switching currents may be introduced. Switching currents contribute to power consumption and introduce power noise that causes jitter, duty cycle degradation through power wire parasitic resistor and package/printed circuit board parasitic inductances.

Therefore, there is a need to develop better drivers to accommodate the conditions of the higher rate, higher density DRAM systems such as those proposed in the DDR5 standard.

SUMMARY

According to some embodiments, an output driver that for a low-voltage asymmetric termination is presented. An output driver can include a delay generator configured to produce a plurality of delay signals in response to an input signal; a pre-driver configured to produce a plurality of control signals based on the plurality of shifted delay signals; and a main driver configured to couple to a channel with an asymmetric termination and provide an output signal at a node of the main driver based in response to the plurality of control signals, wherein the plurality of control signals provides for an asymmetric response in the main driver in response to the asymmetric termination. In some embodiments, an asymmetric switching sequence can be included. In some embodiments, a pull-up diode can be engaged. In some embodiments, the output driver is arranged to operate with core voltages and core transistors.

A method of driving an output signal in a channel with an asymmetric termination can include receiving an input signal; generating, in a delay generator, a plurality of delay signals in response to the input signal; producing, in a pre-driver, a plurality of control signals based on the plurality of delay signals; and providing, in a main driver, an output signal at a node that can be coupled to the channel with the asymmetric termination in response to the plurality of control signals, wherein the plurality of control signals provides for an asymmetric response in the main driver in response to the asymmetric termination.

These and other embodiments are discussed below with respect to the following figures.

BRIEF DESCRIPTION OF THE FIGURES

FIG. 8 further illustrates a block diagram of a driver system according to aspects of the present disclosure.

FIGS. 9A and 9B illustrate a diode pre-driver according to aspects of the present disclosure.

Figure 1A:
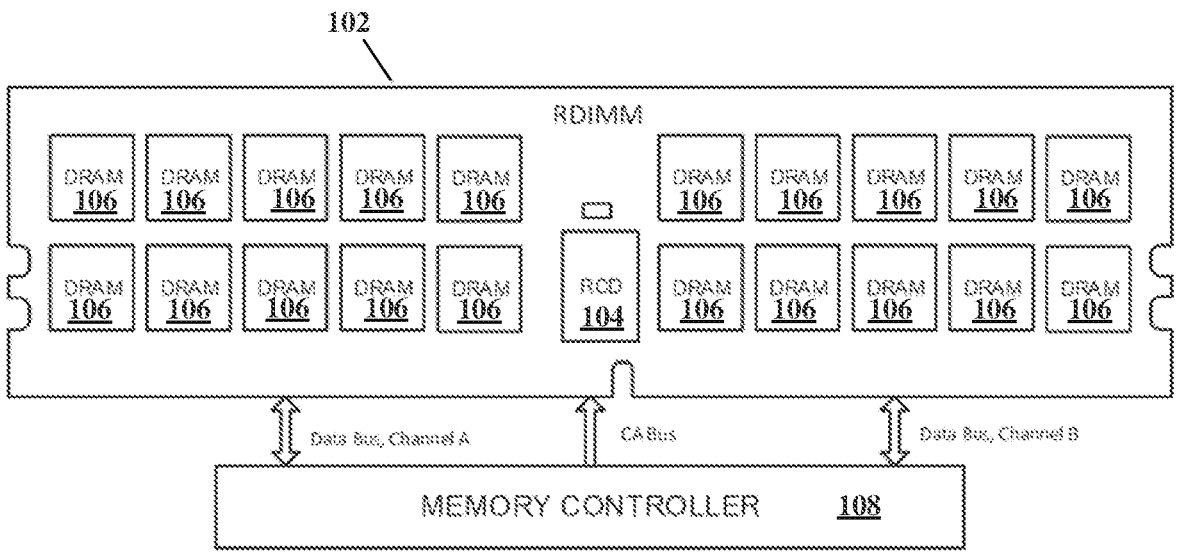
FIGS. 1A and 1B illustrate a registered DEMI (RDIMM) and a load reduced DIMM (LRDIMM) on which embodiments of the present disclosure may be implemented.

These figures are further discussed below.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description illustrates inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

In accordance with aspects of the present disclosure, a low-power voltage-mode output driver with an asymmetrical power-supply termination scheme is presented. In particular, under the DDR5 standard, the termination resistance Rtt is connected to the I/O voltage Vdd instead of Vdd/2 as it is in DDR4. As discussed in further detail below, the power-supply termination resistor leads to an asymmetric output waveform for a low-power driver. By using one or more of an asymmetric termination sequence and a pull-up diode at the driver output, the driver can provide symmetric waveforms with different termination resistances. In particular, aspects of the present disclosure provide for a delay generator configured to produce a plurality of delay signals in response to an input signal; a pre-driver configured to produce a plurality of control signals based on the plurality of shifted delay signals; and a main driver configured to couple to a channel with an asymmetric termination and provide an output signal at a node of the main driver based in response to the plurality of control signals, wherein the plurality of control signals provides for an asymmetric response in the main driver in response to the asymmetric termination. The main driver may include a plurality of slices, each slice having a pull-up transistor and a pull-down transistor that are driven by pull-up signals and pull-down signals generated by the pre-driver in response to rising and falling edges of the delay signals. In some embodiments, the pre-driver produces signals to turn on and off the pull-up transistors and the pull-down transistors in accordance with an asymmetric switching sequence. In some embodiments, the pre-driver and the main driver operate with core transistors at core voltages, for example, the voltages appropriate for the DDR5 configuration. In some embodiments, a diode pre-driver and diode block may be included to provide current that assists in providing a rising edge of the output signal.

In general, aspects of the present invention provide for an output signal from the driver that is symmetric (i.e. has similar rising and falling edges and a 50% duty cycle) regardless of the asymmetric nature of the termination. Consequently, aspects of this disclosure are applicable to double data rate (DDR) random access memories (RAMs) with asymmetric output structures, such as that proposed for the new DDR fifth generation (DDR5) standard.

DDR5 is the next generation standard for RAM which has many performance improvements over the last generation RAM, DDR4. DDR5 revises the DDR4 standard with a focus on increasing bandwidth and improving power consumptions. The upper limits for the DDR5 RAM standard is 6400 MT/s, which has a large improvement over the 3200 MT/s rate of the DDR4 standard. Therefore, devices according to the DDR5 standard present design challenges to achieve these performance improvements.

Figure 1B:
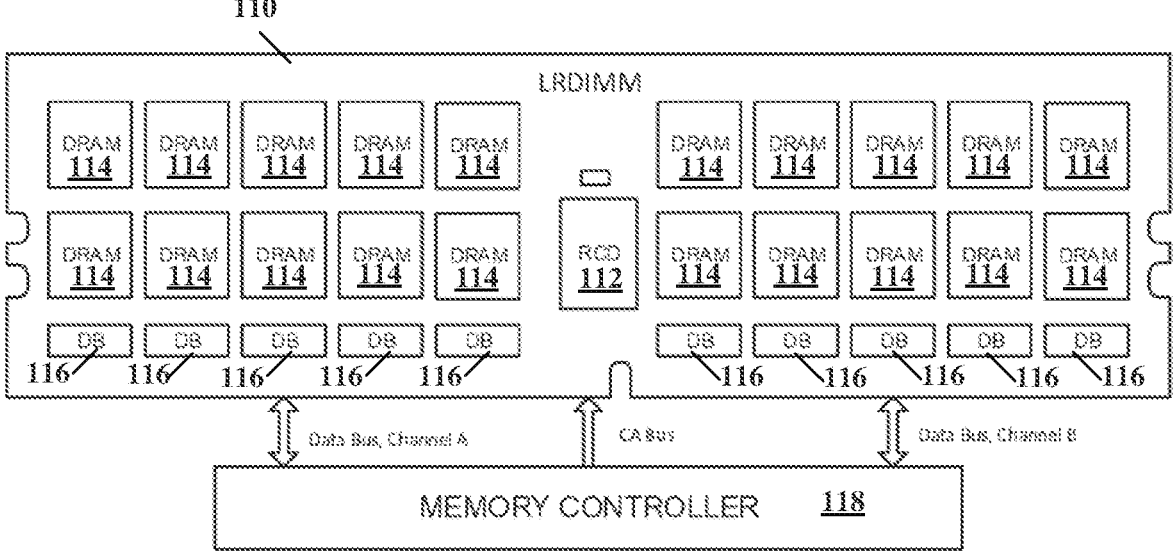

FIG. 1A illustrates an example of a registered dual in-line memory module (RDIMM) 102 while FIG. 1B illustrates an example of a load-reduced DIMM (LRDIMM) 110 on which embodiments of the present disclosure can be implemented. As illustrated in FIG. 1A, RDIMM 102 includes a registering clock driver (RCD) 104, a first array of DRAMs 106 providing data to the channel A data bus and a second array of DRAMs 106 providing data to a channel B data bus. As discussed above, under DDR5 each of channel A and channel B are either 32 bits or 40 bits wide, depending on actual configurations. RCD 104 is configured to take the command address bus, control signals, and clock signals from a memory controller 108 and provides those signals to the array of DRAMs 106 on the chip. The data bus for the DQ signals and DQ strobes (DQS) go directly from memory controller 108 to DRAMs 106. RCD 104 buffers the command/address bus, control signals, and the input clock to DRAMs 106.

FIG. 1B illustrates an example of an LRDIMM 110 on which embodiments of the present disclosure can be implemented. LRDIMM 112 includes an RCD 112, a first array of DRAMs 114 providing data to a channel A data bus, a second array of DRAMs 114 providing data to a channel B data bus, a first array of data buffers 116 coupled between the first array of DRAMs 114 and the channel A data bus, and a second array of data buffers 116 coupled between the second array of DRAMs 114 and the channel B data bus. As discussed above with respect to RDIMM 102, RCD 112 receives command/address bus, control signals, and clock signals. Data buffers 116 buffer data and DQ and DQS signals to DRAMs 114. As discussed above, each of channel A and channel B can be 32 bits plus an 8 bit error correction code (ECC) byte for 40 bits per channel, consequently, there may be five (5) 8-bit data buffers.

It is generally considered that RDIMM 102 may be provide lower latencies while LRDIMM 110 provides higher DRAM memory capacity. These considerations may be important design decisions for a particular application. Embodiments of the present invention can be used in RCD 104 or RCD 112 to drive signals to DRAMs 106 or DRAMs 114, respectively. As discussed above, RCD 104 and RCD 112 buffers the command and address bus as well as other control signals and clock signals between memory controller 108 and memory controller 118, respectively, and DRAMs 106 or DRAMs 114, respectively.

Figure 2:
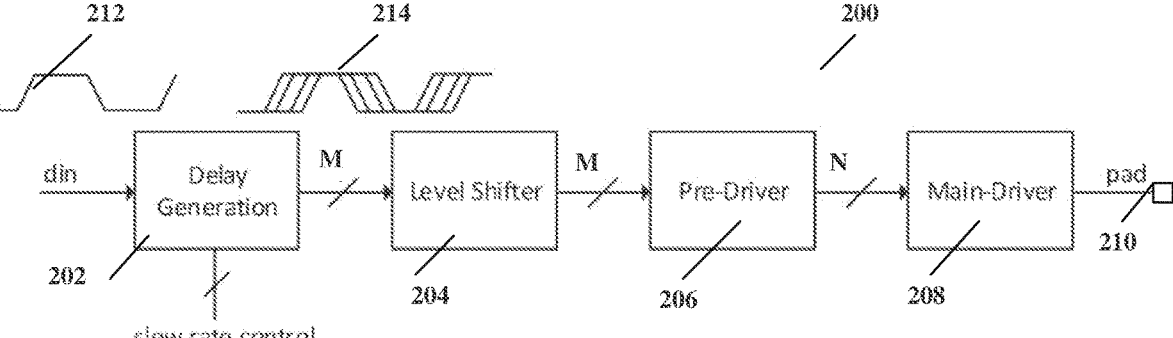
FIG. 2 illustrates a block-diagram of a driver system on which aspects of the present disclosure can be implemented.

FIG. 2 illustrates a block diagram of a driver 200 on which aspects of the present disclosure can be implemented. As illustrated in FIG. 2, an input signal din 212 is input to a delay generation block 202. In general, delay generation 202 can generate M delay signals 214 from the input signal din 212 using delays in response to slew-rate control signals, which determines the spacing between M delay signals 214. The M delay signals 214 are input to a level shifter 204. Level shifter 204 produces M signals 214 that have an appropriate signal swing to be used in pre-driver 206.

Pre-driver 206, based on the rising and falling edges of the M delay signals 214, provide signals for N individual slices of main driver 208. The N individual slices control the rise and fall of the output signal presented to pad 210. Main driver 208 includes a series of individual drivers, slices, that each include a pull-up transistor in series with a pull-down transistor that are activated to provide a signal at pad 210 responsive to the input signal din 212. Such an arrangement also provides a controlled slew rate to the output signal, which can minimize the crowbar current and control the power consumption of main driver 208. These N individual slices are discussed further below.

Figure 3A:
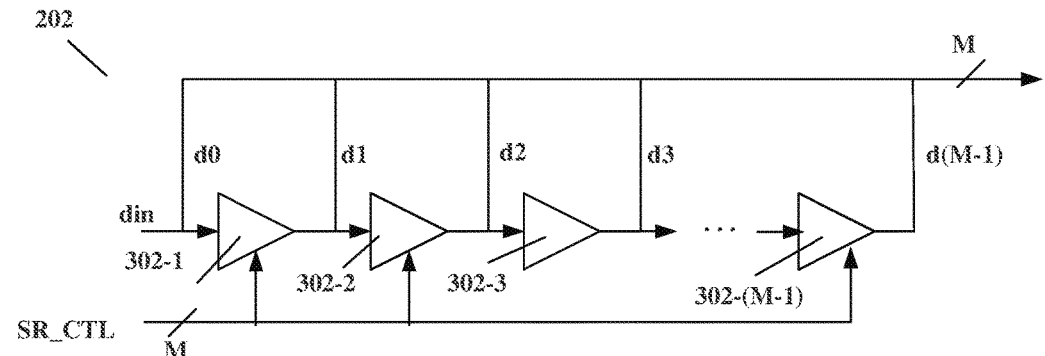
FIGS. 3A and 3B illustrates an example delay generation in the driver system illustrated in FIG. 2.
Figure 3B:
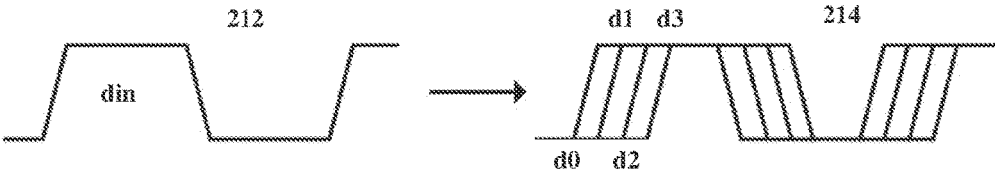

FIGS. 3A and 3B illustrate an example of delay generation block 202. As illustrated in FIG. 3A, M−1 delays 302-1 through 302-(M−1) are coupled in series with delay 302-1 receiving the input signal din 212. The input signal din 212, labeled d0 in FIG. 3A, along with the outputs of each of delays 302-1 through 302-(M−1), labeled d1 through d(M−1), are provided in a combined output signal to level shifter 204 as illustrated in FIG. 2. The M delay signals 214 then can be labeled d0, d1, d2, d3, . . . d(M−1). FIG. 3B illustrates an example combined M signals 214 for the particular example of M=4.

As is further illustrated in FIG. 3A, each of delays 302-1 through 302-(M−1) receives slew-rate control bits that determine that can be used to tune the delay spacing between the M signals 214. This has the effect of controlling the slew rate of the output signal from main driver 208. As was discussed above, level shifter 204 shifts the delayed M signals 214 to an appropriate voltage level that is usable by pre-driver 206. Pre-driver 206 converts the M delay signals into a group of control signals to control the N individual slices incorporated in main driver 208.

Figure 4:
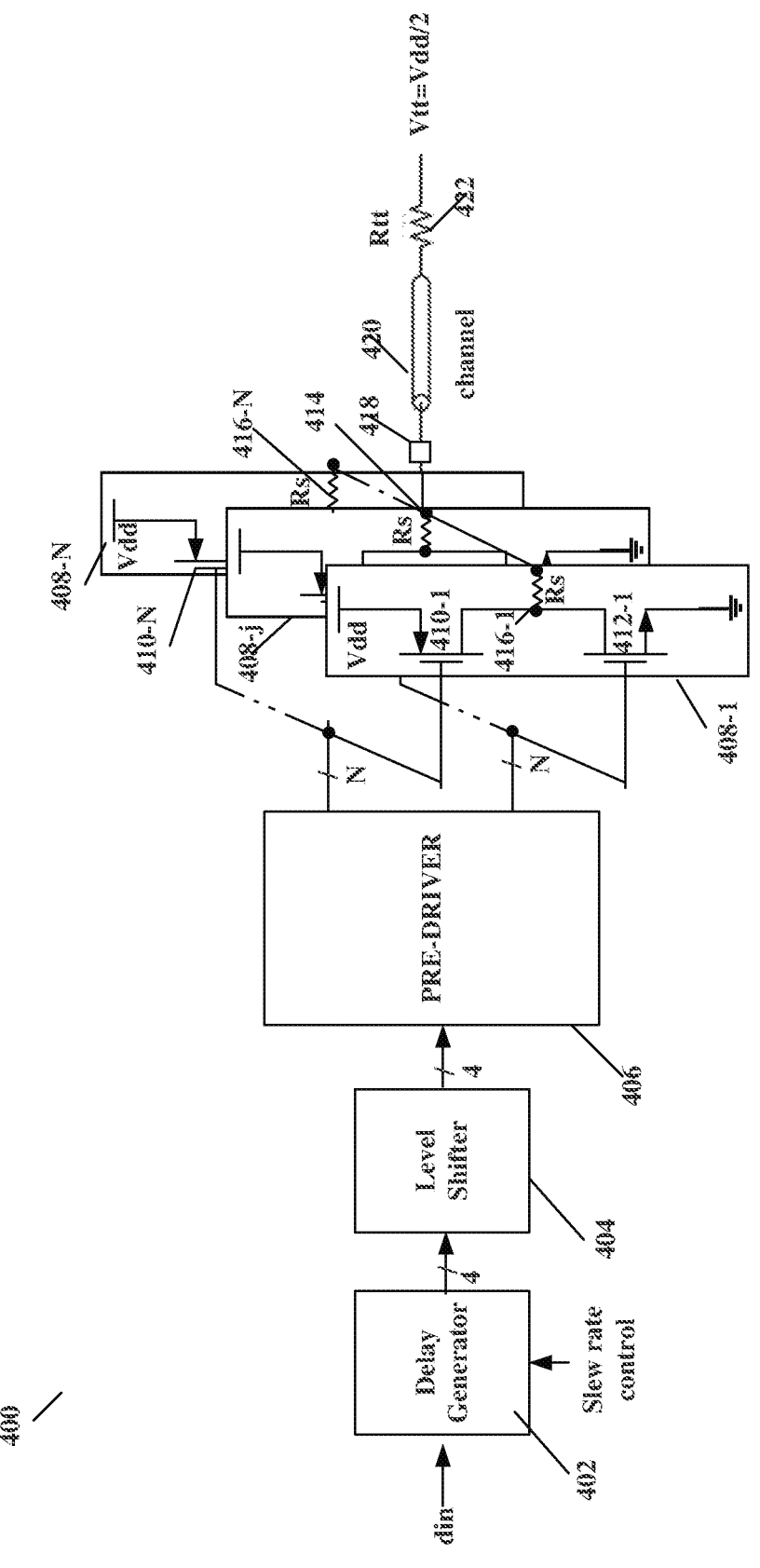
FIG. 4 illustrates an example driver system that is appropriate for a symmetric DDR4 application.

FIG. 4 illustrates an example of a driver circuit 400 that is appropriate for the DDR4 configuration. This driver is further described in U.S. Publication 2017/0201243 (Zhigang Hu, et a., "Signal Driver Slew Rate Control"), which is herein incorporated by reference in its entirety. Driver circuit 400 as illustrated in FIG. 4 is appropriate for a symmetrical termination case. In the symmetrical case, for example in accordance with the DDR4 specification, a termination resistor Rtt 422 is connected to a termination voltage Vtt that is Vdd/2 so that level transitions, i.e. the pull-up and pull-down transitions, are symmetrical around the termination voltage Vtt. Aspects of the present disclosure, as discussed below, is appropriate for an asymmetric situation, such as that proposed for DDR5, where Vtt is connected to the voltage Vdd instead of Vdd/2 as illustrated in FIG. 4.

As illustrated in FIG. 4, an input data signal din is input to delay generator 402, which may be that described above in FIGS. 3A and 3B. In this example, M=4 and therefore the delay signals include signals d0, d1, d2, and d3 as illustrated in FIG. 3B. As discussed above, the delayed signals have rising edges and falling edges that are based on the input signal din. The four delayed signals are then input to level shifter 404 that, as discussed above with respect to level shifter 204, shifts the voltage level of the four delayed signals to be useable in pre-driver 406. The level adjusted delayed signals are then input to pre-driver 406, which provides signals to a main driver 408.

As illustrated in FIG. 4, main driver 408 includes N parallel drivers (also referred to as slices) 408-1 through 408-N. In DDR4, for example, the four delayed waveforms with rising edges and falling edges according to the input waveform are input to pre-driver 406. Pre-driver 406, based on the rising and falling edges of the four waveforms, provides N slice driving signals to main driver 408. As discussed above, main driver 408 includes an array of N slices 408-1 through 408-N. Each of slices 408-1 through 408-N includes a pull-up transistors 410 and a pull-down transistor 412 series coupled between power Vdd and ground GND. As illustrated, for example, driver 408-1 includes transistors 410-1 and 412-1 coupled in series between Vdd and GND. The N slices 408-1 through 408-N are arranged in parallel a coupled to a node 414 through a resistor Rs 416-1-through 416-N, respectively, coupled between transistors 410 and 412 of each of slices 408-1 through 408-N. The combined signal at node 414 is coupled to a pad 418.

Pre-driver 406 provides individual control signals to each of the gates of pull-up transistors 410-1 through 410-N and pull-down transistors 412-1 through 412-N to control operation of each of slices 408-1 through 408-N. Each of slices 408-1 through 408-N is driven by a corresponding one of an array of parallel pre-drivers to slices 408 as discussed further below.

As illustrated in FIG. 4, pad 418 is coupled through channel 420 to a termination resistance Rtt 422. Termination resistance Rtt 422 is coupled to a termination voltage Vtt=Vdd/2 to provide for a symmetric operation. In the DDR4 specification, for example, the center-tap termination scheme is used (Vtt=Vdd/2) so driver 408 pull-up and pull-down legs can be symmetrical, i.e. designed to operate in the same way on rising edges as on falling edges of the delay signals from delay generator 402. This allows the output main driver 408 to have a symmetrical signal swing around Vdd/2, resulting in the pull-up and pull-down legs of driver 206 to be designed in the same way.

Figure 5:
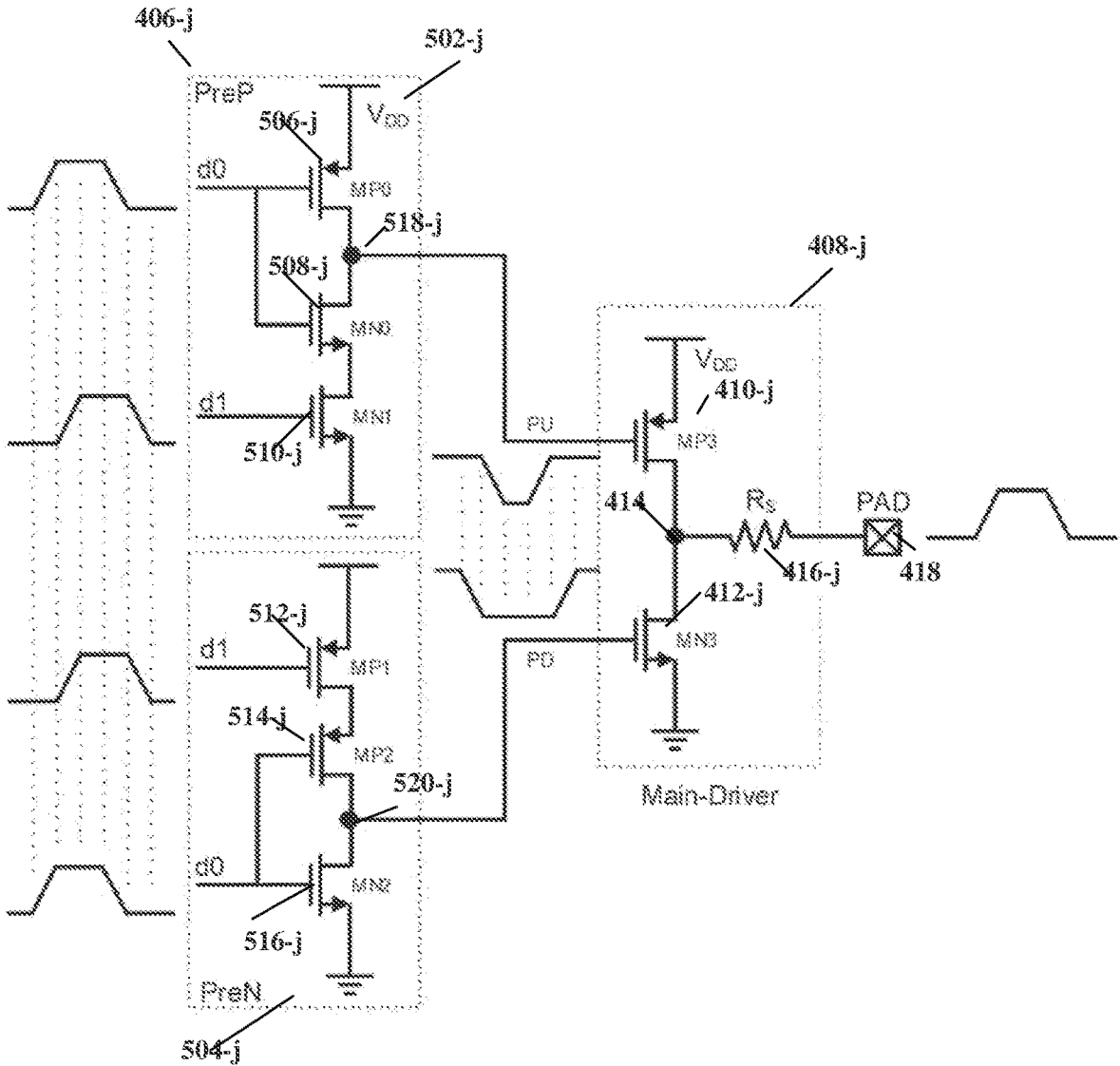
FIG. 5 illustrates an example pre-driver and corresponding slice of the main driver illustrated in FIG. 4 for DDR4 applications.

FIG. 5 further illustrates driver system 400 as illustrated in FIG. 4. To provide for a favorable slew rate for switching voltages at pad 418, transistors 410-1 through 410-N and transistors 412-1 through 412-N are switched in a switching sequence that is pre-established based on the delayed signals generated by delay generator 402. Individual slices 408-1 through 408-N are controlled individually to minimize the crowbar current and the dynamic power consumption of the inverter-like output driver slices.

FIG. 5 illustrates a single main driver slice 408-*j* coupled with the corresponding pre-driver 406-*j*. As discussed above, each slice 408-1 through 408-N is coupled to an independent pre-driver 406-1 through 406-N to operate the slice according to a switching sequence. Each independent pre-driver 406-1 through 406-N is configured to receive one or more of the delay signals to drive main-driver slice 408-*j* according to the determined switching sequence. The pre-driver provides a PU signal for controlling the gate of pull-up transistor 410-*j* and a PD signal for controlling the gate of pull-down transistor 412-*j*. In the example illustrated in Figure pull-up transistor is activated on the rising edge of delay signal d1 and deactivated on the falling edge of delay signal d0 while pull-down transistor is deactivated on the rising edge of delay signal d0 and activated on the falling edge of d1.

As illustrated in FIG. 5, pre-driver 406-*j* includes a top pre-driver 502-*j* and a bottom pre-driver 504-*j*. In the example illustrated in FIG. 5, top pre-driver 502-*j* includes p-type transistor 506-*j* and two N-type transistors 508-*j* and 510-*j* coupled in series between Vdd and GND. In this particular example, the gates of p-channel transistor 506-*j* and n-channel transistor 508-*j* are driven by delay signal d0. Consequently, when d0 is low transistor 506-*j* is on and transistor 508-*j* is off. The gate of n-channel transistor 510-*j* is driven by delay signal d1 and therefore is off when d1 is low and on when d1 is high. Top pre-driver 502-*j* supplies a pull-up signal PU from node 518-*j*, which is between series-coupled transistors 506-*j* and 508-*j*, to p-channel transistor 410-*j* of main-driver slice 408-*j*. Consequently, PU is high except when both d0 and d1 are high, in which case PU is low. Further, during the transition of d1 from low to high, both transistors 506-*j* and 508-*j* are off so that transistor 412-*j* is off before transistor 410-*j* turns on.

Low pre-driver 504-*j* includes p-channel transistors 512-*j* and 514-*j* and N-channel transistor 516-*j* coupled in series between Vdd and ground. The gate of p-channel transistor 512-*j* is coupled to delay signal d1. Therefore, transistor 512-*j* is on when d1 is low and off when d1 is high. P-channel transistor 514-*j* and n-channel transistor 516-*j* have gates coupled to delay signal d0. Consequently, when d0 is low, transistor 514-*j* is on and transistor 516-*j* is off, and when d0 is high, transistor 514-*j* is off and transistor 516-*j* is on. The pull-down (PD) signal to the gate of n-channel transistor 412-*j* is provided at node 520-*j*, which is between transistors 514-*j* and 516-*j*. Consequently, the PD signal to the gate of transistor 412-$j$ is high when both d0 and d1 are low. In the falling transition of d1, both transistors 512-$j$ and 516-$j$ are off so that transistor 410-$j$ is turned off before transistor 412-$j$ is turned on.

Consequently, the signal contribution from slice 408-$j$ is low and transitions to high when signal d1 transitions to high (when d0 has already transitioned to high) and transitions again to low when signal d1 transitions to low (when d0 has already transitioned to low). As discussed above, there are a total of N slices 408 (slices 408-1 through 408-N). Each of slices 408-1 through 408-N is driven by a corresponding pre-driver 406-1 through 406-N that is arranged to operate according to the switching sequence. Each of pre-drivers 406-1 through 406-N receives appropriate delay signals and has an architecture appropriate to operate each of the corresponding slices 408-1 through 408-N according to the determined switching sequence.

Depending on loading conditions, part or all of the N slices are enabled to have different equivalent driver resistances Ron. As is known, each of transistors 410-$j$ and 412-$j$ have on resistances. In the symmetric example that is illustrated in FIGS. 4 and 5, depending on loading conditions part or all of the N slices 408-1 through 408-N are enabled to have different equivalent driver resistances Ron. For example, if the pull-up or pull-down resistance of each slices 408-1 through 408-N is Req=240Ω, then an equivalent driver resistance of Ron=10Ω uses N=24 slices 408-1 through 408-24. For rising edges, each pre-driver 502-$j$ and slice 408-$j$ are arranged such that pull-up transistor 410-$j$ is turned on after pull-down transistor 412-$j$ is turned off and on falling edges that pull-down transistor 412-$j$ is turned on after pull-up transistor 410-$j$ is turned off.

As discussed above, pre-drivers 406-1 through 406-N and corresponding slices 408-1 through 408-N are arranged such that slices 408-1 through 408-N are transitioned according to a switching sequence. In the symmetric example, which is consistent with the DDR4 standard, pre-driver 406 and main driver 408 are arranged to follow the switching sequence as indicated in Table 1.

TABLE 1

| Switching Sequence for Symmetric Loading | | | | | |
| --- | --- | --- | --- | --- | --- |
| Rising edge | Falling edge | d0 | d1 | d2 | d3 |
| PU (on) | PD (on) | n0_on | n1_on | n2_on | n3_on |
| PD (off) | PU (off) | n0_off | n1_off | n2_off | n3_off |

On the rising edge of the output signal from driver 408, the parameters n0_on, n1_on, n2_on, and n3 on indicate the number of slices 408 where pull-up transistors 410 is turned on with the rising edge of delay signals d0, d1, d2, and d3, respectively. Further on the rising edge of the output signal, the parameters n0_off, n1_off, n2_off, and n3_off indicate the number of slices 408 where pull-down transistors 412 are turned off with the rising edge of delay signals d0, d1, d2, and d3, respectively. On the falling edge of the output signal, the parameters n0_on, n1_on, n2_on, and n3 on indicate the number of slices 408 where pull-down transistors 412 are turned on with the falling edge of delay signals d0, d1, d2, and d3, respectively. Further on the falling edge of the output signal, the parameters n0_off, n1_off, n2_off, and n3_off indicate the number of slices 408 where pull-up transistor 408 is turned off on the falling edge of d0, d1, d2, and d3, respectively.

As is apparent from Table 1, (n0 on)+(n1_on)+(n2_on)+(n3_on)=N and (n0_off)+(n1_off)+(n2_off)+(n3_off)=N.

Consequently, at the end of the sequence either all of pull-up transistors 410-1 through 410-N are on (or off) and all of pull-down transistors 412-1 through 412-off are correspondingly off (or on). At the start of the rising edge of the output signal, all of slices 408-1 through 408-N are configured with pull-down transistors 412-1 through 412-N being on and pull-up transistors 410-1 through 410-N being off. On the rising edge of delay signal d0, in n0_on slices 408 the pull-up transistor 410 is turned on and in n0_off slices 408 the pull-down transistor 412 is turned off. On the rising edge of delay signal d1, in n1_on slices 408 the pull-up transistor 410 is turned on and in n1_off slices 408 the pull-down transistor 412 is turned off. On the rising edge of delay signal d2, in n2_on slices 408 the pull-up transistor 410 is turned on and in n2_off slices 408 the pull-down transistor 412 is turned off. On the rising edge of delay signal d3, in n3_on slices 408 the pull-up transistor 410 is turned on and in n3_off slices 408 the pull-down transistor 412 is turned off. At this point all of N pull-up transistors 410 are on and all N of pull-down transistors 412 are off.

As discussed above, because of the symmetric situation, the falling edge sequence is the same as the rising edge sequence. As is illustrated in Table 1, on the falling edge sequence at the beginning all slices 408-1 through 408-N are configured with pull-up transistors 410 on while all pull-down transistors 412 are off. On the falling edge of delay signal d0, in n0_on slices 408 the pull-down transistor 412 is turned on and in n0_off slices 408 the pull-up transistor 410 is turned off. On the falling edge of delay signal d1, in n1_on slices 408 the pull-down transistor 412 is turned on and in n1_off slices 408 are the pull-up transistor 410 turned off. On the falling edge of delay signal d2, in n2_on slices 408 the pull-down transistor 412 is turned on and in n1_off slices 408 the pull-up transistor 410 is turned off. On the rising edge of delay signal d3, in n3_on slices 408 the pull-down transistor 412 is turned on and in n1_off slices 408 the pull-up transistor 410 is turned off At this point all of N pull-up transistors 410 are off and all of pull-down transistors 412 are on.

As is discussed above, the configuration of pre-driver 406 and main driver 408 as well as the number of slices N in main driver 408 and the switching sequence as illustrated in FIGS. 4 and 5 can be determined by modeling based on the characteristics of channel 420, resistances Rs 416-1 through 416-N, the characteristics of transistors 410 and 412, and the termination resistance Rtt. Pre-driver 406 and main driver 408 can be configured according to the modeling.

In the new Joint Electron Device Engineering Council (JEDEC) DDR5 specification, however an asymmetric termination loading at the DRAM side is provided, among other things. This poses significant difficulties in driver design. In the DDR5 standard, the supply-termination has been changed to reduce power consumption. In the DDR5 termination scheme, the equivalent pull-up and pull-down impedance transition is no longer equal. However, the driver should also have symmetrical signaling (i.e. a 50% duty cycle with symmetric rising and falling edges) regardless of the asymmetrical loading characteristics. Consequently, the symmetric sequences as illustrated in Table I cannot be used.

Figure 6:
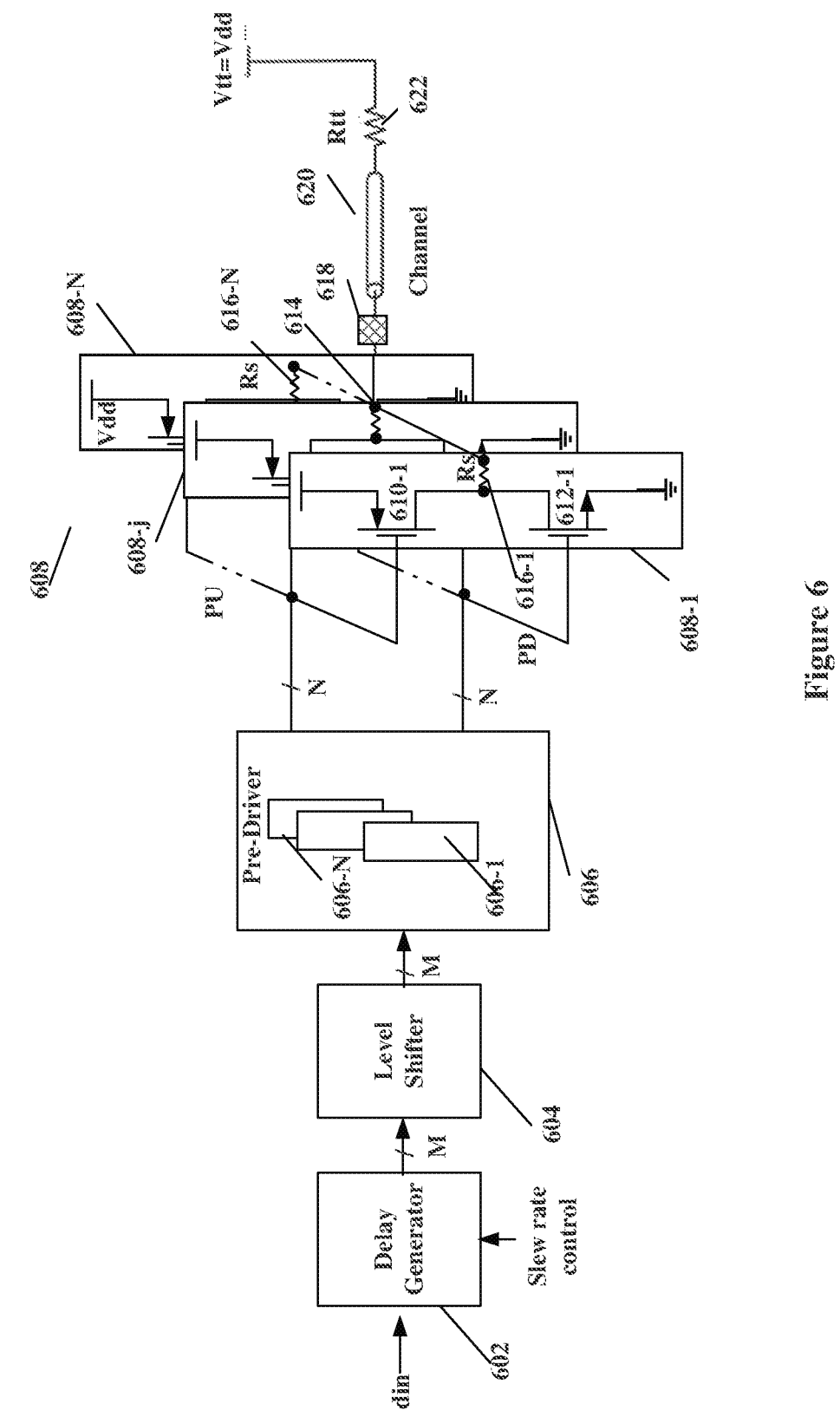
FIG. 6 illustrates an asymmetric driver system according to aspects of the present disclosure.

FIG. 6 illustrates an embodiment of an output driver 600 for the asymmetric situation according to aspects of the present disclosure. Aspects of output driver 600 may be appropriate for the JEDEC DDR5 standard. As illustrated in FIG. 6, the input signal din is input to delay generator 602. Delay generator 602 can be delay generator 202 as illustrated in FIGS. 3A and 3B above. As illustrated in FIG. 6, delay generator 602 generates M delay signals based on the input signal din. The M delay signals generated by delay generator 602 can then be input to level shifter 604. As discussed above with respect to level shifter 204 of FIG. 2, level shifter 604 provides M delay signals with voltage levels adjusted to be used by pre-driver 606.

Pre-driver 606 is configured to produce N signals to drive transistors in the N slices of main driver 608, slices 608-1 through 608-N. As illustrated in FIG. 6, pre-driver 606 may be formed of N pre-drivers 606-1 through 606-N, each of them producing one of the N sets of signals for the N slices 608-1 through 608-N of main driver 608.

Each of main driver slices 608-1 through 608-N includes a pull-up transistor 610 and a pull-down transistor 612 that are series coupled between Vdd and ground. For example, slice 608-1 includes a p-channel pull-up transistor 610 coupled in series with n-channel pull-down transistor 612-1 between Vdd and ground. The gates of each of pull-up transistors 610-1 through 610-N and each of pull-down transistors 612-1 through 612-N are independently driven by pre-driver 606. The connection between each pull-up transistor 610-1 through 610-N and each pull-down transistor 612-1 through 612-N, respectively, is coupled through resistors Rs 616-1 through 616-N to node 614. The output signal from main driver 608 is provided through node 614 to pad 618. Pad 618 is then coupled through channel 620 to terminal resistance Rtt 622, which in the asymmetric case is connected to Vtt=Vdd.

As illustrated in FIG. 6, pre-driver 606 provides N PU signals, one for each of pull-up transistors 610-1 through 612-N, and N PD signals, one for each of pull-down transistors 612-1 through 612-N. In aspects of the present disclosure, pre-driver can arrange the PU signals and the PD signals to provide for an asymmetric switching sequence. In an asymmetric switching sequence, the sequence different for rising edges of the delay signals (corresponding to the rising edge of the output signal) than it is for the falling edges of the delay signals (corresponding to the falling edge of the output signal). Table 2 illustrates an example asymmetric switching sequence in an example where M=4, resulting in delay signals d0, d1, d2, and d3.

TABLE 2

| Switching sequence in asymmetric systems | | | |
|---|---|---|---|
| | d0 | d1 | d2 | d3 |
| Rising edge | | | | |
| pull-up (on) | n0__on R | n1__on R | n2__off R | n3__on R |
| pull-down (off) | n0__off R | n1__off R | n2__off R | n3__off R |
| Falling edge | | | | |
| Pull-down (on) | n0__on F | n1__on F | n2__on F | n3__on F |
| Pull-Up (off) | n0__off F | n1__off F | n2__off F | n3__off F |

The parameters n0_on_R, n1_on_R, n2_on_R, n3_on_R indicate the number of slices 608 where the pull-up transistor 610 is turned on the rising edge of delay signals d0, d1, d2, and d3 respectively. The parameters n0_off_R, n1_off_R, n2_off_R, and n3_off_R indicate the number of slices 608 where the pull-down transistor 612 is turned off on the rising edge of delay signals d0, d1, d2, and d3, respectively. The parameters n0_on_F, n1_on_F, n2_on_F, and n3_on_F indicate the number of slices 608 where the pull-down transistors 612 are turned on with the falling edge of delay signals d0, d1, d2, and d3, respectively. The parameters n0_off_F, n1_off_F, n2_off_F, and n3_off_F are turned off with the falling edge of delay signals d0, d1, d2, and d3, respectively. As is evident, n0_on_R+n1_on_R+n2_on_R+n3_on_R=N; n0_off_R+n1_off_R+n2_off_R+Ne_off_R=N; n0_on_F+n1_on_F+n2_on_F+n3_on_F=N; and n0_off_F+n1_off_F+n2_off_F+n3_off_F=N. Consequently, prior to the rising edge sequence, all off pull-up transistors 610-1 through 610-N are off and all of pull-down transistors 612-1 through 612-N are on and prior to the falling edge sequence all of pull-up transistors 610-1 through 610-N are on and all of pull-down transistors 612-1 through 612-N are off. The sequence provides a controlled sequence between main driver 608 being fully on (i.e. all of pull-up transistors 610 being on) and main driver 608 being full off (i.e. all of pull-down transistors 612 being on).

In accordance with aspects of the present invention, the rising and falling switching sequences are different to compensate for the pull-up capability of termination resistor Rtt 622, which is connected to Vdd. In particular, this relationship can be represented as follows:

(n0_on_R, n1_on_R, n2_on_R, n3_on_R)≠(n0_on_F, n1_on_F, n2_on_F, n3_on_F); and (n0_off_R, n1_off_R, n2_off_R, n3_off_R)≠(n0_off_F, n1_off_F, n2_off_F, n3_off_F).

As discussed above, the number of slices N, the configuration of pre-driver 606 and each of slices 608-1 through 608-N, and the parameters discussed above for the switching sequence can be determined by simulations that depend, at least in part, on the characteristics of channel 620, terminal resistance Rtt 622, and the on resistance of main driver 608. As discussed above, the output signal at node 614 is a function of the number of slices 608-1 through 608-N where the pull-up transistor 610 is on and the number of slices 608-1 through 608-N where the pull-down transistor 612 is on. The switching sequence, then, controls the characteristics of the rising and falling edges of the output signal, i.e. the transition between low output signal at pad 618 and high output signal at pad 618.

Figure 7:
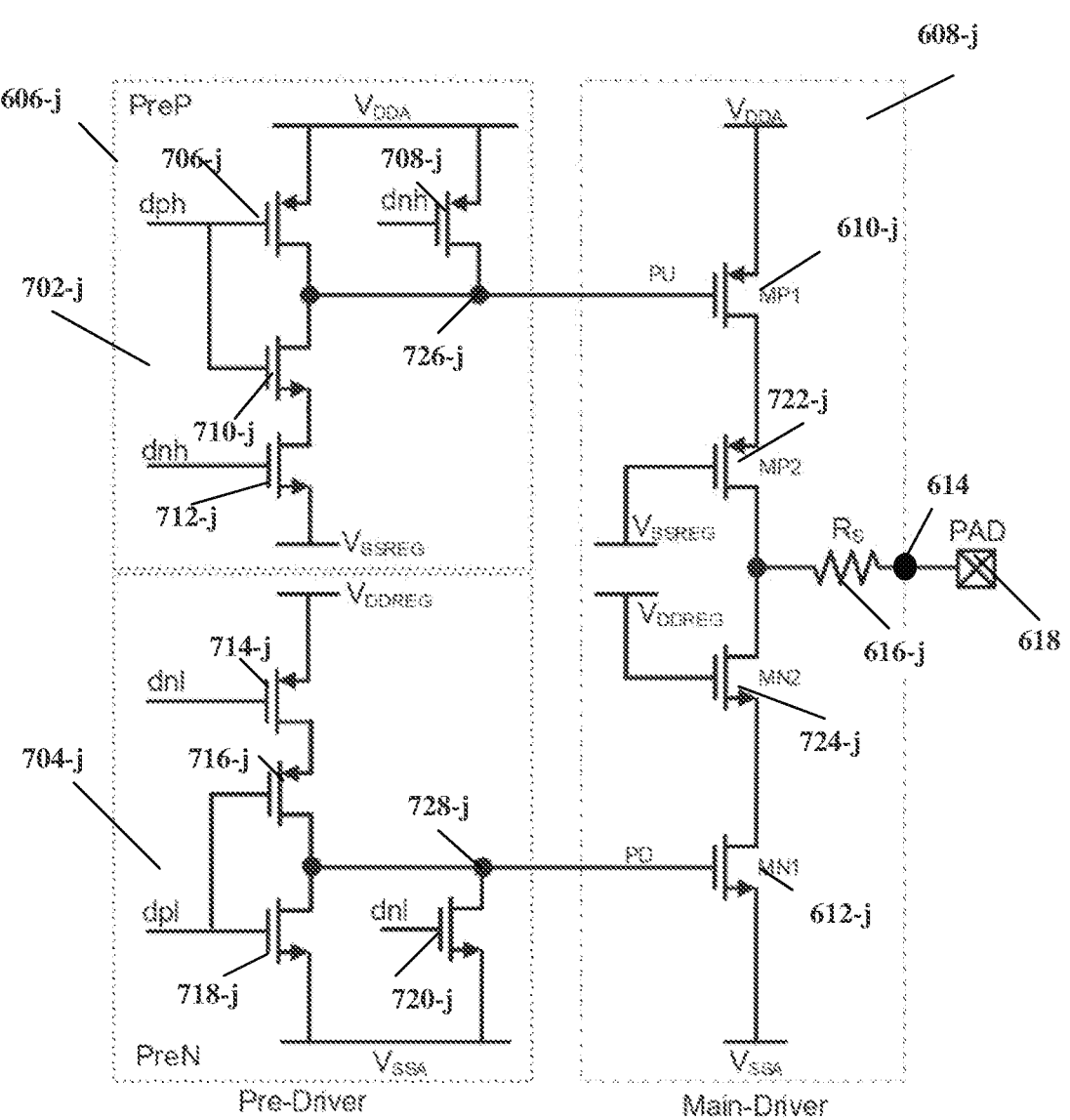
FIG. 7 illustrates an example pre-driver and corresponding slice of the driver as illustrated in FIG. 6 according to aspects of the present disclosure.

In addition to the asymmetric switching sequence as discussed above, some aspects of the present disclosure can use core voltages with core transistors while working with I/O voltages. I/O transistors are not fast enough to be used in the latest generation of memory interface devices and core devices are used. Core devices work with lower voltages. Protection devices can be used to avoid over-voltage events. A pre-driver 606-j coupled with a main-driver slice 608-j according to some aspects of the present disclosure is illustrated in FIG. 7. FIG. 7 illustrates a pre-driver 606-j and main-driver slice 608-j operating with I/O power using core transistor devices.

As illustrated in FIG. 7, consistently with the DDR5 standard, the following voltages may be used: VDDA=1.1V, VSSA=0V, VDDREG=0.875V, and VSSRG=0.225V. In other systems, other voltages may be used for these values. As is illustrated in FIG. 7, main driver slice 608-j includes a pull-up transistor 610-j coupled in series with pull-down transistor 612-j between VDDA and VSSA. As discussed above, node 614 is the node between pull-up transistor 610-j and pull-down transistor 612-j. As indicated, pull-up transistor 610-j may be a p-channel FET while pull-down transistor 612-j can be a n-channel FET. The gate of pull-up transistor 610-j is driven by a PU signal generated by pre-driver 606-j and the gate of pull-down transistor is driven by a PD signal generated by pre-driver 606-j.

In some embodiments a first p-type transistor 722-j is coupled in series with pull-up transistor 610-j between node 614 and pull-up transistor 610-j. The gate of first p-type transistor 722-j is coupled to VSSRG, which is sufficient to turn transistor 722-j on. Similarly, a second n-type transistor 724-*j* is positioned between node 614 and pull-down transistor 612-*j*. The gate of second n-type transistor 724-*j* is coupled to VDDREG, which again provides sufficient voltage to turn transistor 724-*j* on. Transistors 722-*j* and 724-*j* help insure that the voltage across either of pull-up transistor 610-*j* or pull-down transistor 612-*j* does not become excessive and therefore provide overvoltage protection.

As illustrated in FIG. 7, the PU signal connected to the gate of pull-up transistor 610-*j* is generated by high pre-driver 702-*j* and the PD signal connected to the gate of pull-down transistor 612-*j* is generated by low pre-driver 704-*j*. High pre-driver 702-*j* and low pre-driver 704-*j* form pre-driver section 606-*j* of pre-driver 606. High pre-driver 702-*j* receives two signals dph and dnh that are related to delay signals generated by delay generator 602 and level shifter 604. Similarly, low pre-driver 704-*j* receives two signals dpl and dnl from delay generator 602 and level shifter 604.

In particular, as illustrated in FIG. 6 and discussed above, delay generator 602 generates M delay signals as illustrated in FIGS. 3A and 3B. In a system where M=4, then delay signals d0, d1, d2, and d3 are generator. In according to aspects of the present disclosure, level shifter 604 receives the delay signals and adjusts the voltage levels of the delay signals to a high level appropriate for high pre-driver 702-*j* and to a low level appropriate for low pre-driver 704-*j*. Consequently, dph and dpl correspond to one of the delay signals with voltage levels adjusted appropriately for high pre-driver 702-*j* and low pre-driver 704-*j*, respectively. The signals dnh and dnl correspond to a second of the delay signals with voltage levels adjusted appropriately for high pre-driver 702-*j* and low pre-driver 704-*j*, respectively. Consequently, dph and dnh are adjusted to voltage levels between VSSREG and VDDA and the corresponding signals dpl and dnl are adjusted to voltage levels between VSSA and VDDREG. The particular delay signals that result in the signals dph, dpl, dnh, and dnl are determined to drive main driver slice 608-*j* in accordance with the switching sequence illustrated in Table 2.

As illustrated in FIG. 7, high pre-driver 702-*j* operates between the voltages VDDA and VSSREG and includes p-channel transistor 706-*j* and p-channel transistor 708-*j* coupled in parallel between the voltage VDDA and node 726-*j*. n-channel transistors 710-*j* and 712-*j* are coupled in series between node 726-*j* and the voltage VSSREG. The signal dph is connected to the gates of transistors 706-*j* and 710-*j* while the signal dnh is coupled to transistors 708-*j* and 712-*j*. Consequently, when signal dph and dnh are both low, transistors 706-*j* and 708-*j* are on and transistors 710-*j* and 712-*j* are off pulling the PU signal at node 726-*j* to a high value, VDDA. When signal dph is high while dnh remains low, then transistor 706-*j* is off and transistor 710-*j* is on while transistors 708-*j* is on and transistor 712-*j* is off, leading to a high value for the PU signal at node 726-*j*. When signal dph is high and dnh becomes high, then transistor 706-*j* and 708-*j* are off and transistors 710-*j* and 712-*j* are on, leading to the PU signal at node 726-*j* being a low signal (VSSREG). When signal dph becomes low again while dnh remains high, then transistors 706-*j* is on and transistor 712-*j* is on which transistors 708-*j* and 710-*j* are off, leading to the PU signal at node 726-*j* to again become a high.

Similarly, low pre-driver 704-*j* operates between the voltages VDDREG and VSSA. As illustrated and includes p-channel FETs 714-*j* and 716-*j* coupled between a node 728-*j* and VDDREG. Further, n-channel FETs 718-*j* and 720-*j* are coupled in parallel between node 728-*j* and voltage VSSA. Further, the gates of transistors 716-*j* and 718-*j* are coupled to dpl while the gates of transistors 714-*j* and 720-*j* are coupled to dnl. Consequently, when dpl and dnl are low transistors 714-*j* and 716-*j* are on and transistors 718-*j* and 720-*j* are low, resulting in the PD signal at node 728-*j* being high (i.e. at VDDREG). When dpl becomes high, then transistors 714-*j* and 718-*j* are on and transistors 716-*j* and transistors 720-*j* are off, resulting in the PD signal at node 728-*j* being low. When dpl and dnl both become high, then transistors 714-*j* and 716-*j* are off and transistors 718-*j* and 720-*j* are on, resulting in the PD signal at node 728-*j* remaining low. When dpl becomes low when dnl remains high, then transistors 714-*j* and 718-*j* being off and transistors 716-*j* and 720-*j* being on, resulting in the PD signal at node 728-*j* remaining low. Consequently, when one of dpl and dnl become high, then one of transistors 714-*j* and 716-*j* are off and one of transistors 718-*j* or 720-*j* are on, resulting in node 728-*j* becoming low.

When the PU signal and the PD signal are provided to the gates of transistors 610-*j* and 612-*j*, respectively, of main driver slice 608-*j*. Consequently, the following sequence as illustrated in Table 3 is implemented:

TABLE 3

| Operational sequence for pre-driver 606-j and main driver slice 608-j | | | | |
|---|---|---|---|---|
| dp | L | H | H | L | L |
| dn | L | L | H | H | L |
| PU | H | H | L | H | H |
| PD | H | L | L | L | H |
| Pull-up trans. | Off | Off | On | Off | Off |
| Pull-down trans. | On | Off | Off | Off | On |

As discussed above, each combination of pre-driver 606-*j* and main driver slice 608-*j* is configured to receive the delay signals and, according to the rising and falling edges of the delay signals, is configured to operate according to the switching sequence as illustrated in Table 2. As discussed above, the signals dp and dn correspond to different ones of the delay signals and the signals dph and dnh are voltage level shifted to operate with high pre-driver 702-*j* and signals dpl and dnl are voltage shifted to operate with low pre-driver 704-*j*.

Consequently, the transition from a low output signal to a high output signal begins with the rising edge of the dp signal and finishes at a high output level on the rising edge of the dn signal. The transition from a high output signal to a low output signal begins with the falling edge of the dp signal and finishes at a low output level on the falling edge of the dn signal. As discussed with respect FIG. 6, the overall output signal from main driver 608 is then dependent on the number of slices 608-1 through 608-N are set to provide high output levels and how many are set to provide low output levels. The transition between low and high output levels is thusly controlled by the switching sequence of the slices 608-1 through 608-N, as is illustrated for example by Table 2. Further, each of pre-drivers 606-1 through 606-N receives appropriate ones of the delay signals and is configured to provide PU signals and PD signals to provide for the switching sequence as illustrated in Table 2.

As a result of the embodiments illustrated in FIG. 7, core transistors that operate within voltage levels appropriate for the lowered chip voltages can be used. The resulting switching can be performed at high switching rates and still provide I/O voltage outputs appropriate for providing signaling to DRAMs dispersed throughout the DIMM package. All of the transistors can therefore be core devices. The two transistors 722-*j* and 724-*j*, whose gates are connected to VSSREG and VDDREG, respectively, operate as protection devices. None of the transistors in the architecture illustrated in FIG. 7 have a gate-source voltage VGS that exceeds VDDREG. The upper pre-driver 702-*j* operates between VDDA and VSSREG and the lower pre-driver 704-*j* operates between VDDREG and VSSA, lessening the voltages across each individual transistor.

In order to further help with the asymmetric switching provided by embodiments of the present disclosure, some embodiments can include a switchable pull-up diode to assist in the switching of slices in main driver 608. FIG. 8 illustrates a driver system 800 that incorporates aspects as illustrated in FIGS. 6 and 7 and further includes pull-up diodes to assist in switching.

As illustrated in FIG. 8, driver system 800 includes delay generation 602 to generate delay signals. As discussed above, delay generator 602 can be the same as that illustrated in FIGS. 3A and 3B. As illustrated, the delays between delay signals is determined by slew rate control signals. Consequently, delay generation 602 produces M delay signals. Although M can be any value, in some examples M can be four. The delay signals are then input to level shifter 604.

Level shifter 604 includes an upper level shifter 802 and a lower level shifter 804. Upper level shifter 802 shifts the voltage level of the M delay signals to within the voltages VSSREG and VDDA for operation with upper pre-driver 702, which is discussed above with respect to FIG. 7. Lower level shifter 804 shifts the voltage level of the M delay signals to within the voltages VSSA and VDDREG for operation with lower pre-driver 704, which is discussed above with respect to FIG. 7. As has been discussed above with respect to FIG. 7, pre-driver 606 provides N PU signals and N PD signals for N slices 608-1 through 808-N in main driver 608.

In some aspects of the present disclosure, a pull-up diode can be used at the output of main driver 608 to help provide a symmetric rising and falling edge over various values of terminal resistance Rtt. As is further illustrated in FIG. 8, a lower number P (e.g., 2) of the delay signals is provided to a diode pre-driver 806. Diode pre-driver 806 drives pull-up diodes in a diode array 808. As illustrated in FIG. 8, diode array 808 includes diode blocks 808-1 through 808-L. As illustrated, each of diode blocks 808-1 through 808-L includes a p-type diode enable transistor 810-1 series coupled to a diode 812-1 connected between VDD to node 810, which as discussed above in FIG. 7 is connected to pad 618. As illustrated in FIG. 8, diode pre-driver 806 takes a subset of the M delay signals and produces a diode enable signal that drives each of diode enable transistors 810-1 through 810-L to engage the parallel coupled diode blocks 808-1 through 808-L. For example, the number of diode blocks 808-1 through 808-L that may be enabled can depend on the number of slices N of main driver 608, which is related to the pull-up transistor 610 on resistance Ron. In the example illustrated in FIG. 8, L=4 indicating that there are 4 pull-up diodes. In some examples, these diodes can be enabled for N=9 slices, N=12 slices, N=17 slices and N=24 slices, respectively. Furthermore, the number of diodes enabled can be adjusted to compensate for Rtt resistances, which may vary from about 250 to 500, for example.

The asymmetric switching sequence illustrated in Table 2 can arrange that the rise/fall edges of the output voltage from main driver 608 match for a given value of terminal resistance Rtt. Consequently, variation of terminal resistance Rtt may influence the symmetry of rising and falling edges because the switching sequence makes transistor on resistance Ron variations during transition edges of the delay signals. A smaller value of terminal resistance Rtt results in a faster pull-up than pull-down and a larger value of terminal resistance Rtt makes pull-up slower than pull-down. In aspects of the present disclosure, the influence of the terminal resistance Rtt can be compensated by the pull-up diode formed by parallel diode blocks 808-1 through 808-L. The diode current (the current through the parallel diodes 808-1 through 808-L) is decided by the voltage across the diode, which is determined by the signal amplitude. The signal's amplitude is decided by the resistance ratio of termination resistance Rtt 618 and the on resistance RON for main driver 608. For a small value of Rtt 618, the diode pull-up current is smaller because of the smaller signal amplitude, making the rising edge slower. In a similar way, the pull-up diode makes the rising edge faster for a large value of terminal resistance Rtt 622.

Consequently, parallel diode blocks 808-1 through 808-L helps to maintain the symmetry of the output signal at node 810. Without a diode, the asymmetric nature of the termination influences the symmetry of the output signals. Consequently, if a symmetric output signal is attained for a given value of termination resistance Rtt, that symmetry will be lost for another value of termination resistance Rtt. Parallel diode blocks 808-1 through 808-L can therefore help maintain the symmetry over a range of termination resistances Rtt.

FIG. 9A shows the diode pre-driver 806 according to some embodiments while FIG. 9B illustrates the operating principle for diode pre-driver 806 as illustrated in FIG. 9A. The signals d0*h* and d2*h* are level shifted signals corresponding to d0 and d2 in the (VDDA,VSSREG) power domain. The diode is enabled on a rising edge of d0 is disabled on a rising edge of d2. Therefore, the pull-up diode is only active during the transition of the rising edge of the output signal, which keeps the DC RON unchanged. In some embodiments, the diode diode size can be adjusted by enabling different numbers of parallel diode blocks 808-1 through 808-L. The size of the resulting diode is determined by the number of diodes 1 of diodes 808-1 through 808-L are enabled. Consequently, in some embodiments, a switching sequence can be determined to selectively enable diode blocks 808-1 through 808-L during the rising edge of the output signal from main driver 608. The operation of diode 808 can be fine-tuned according to different channel, operating frequency and termination resistance Rtt 622 variation range to set the switching sequence for diode 808.

FIGS. 9A and 9B illustrates an example of diode pre-driver 806 and its operation. In this example, M=4, P=2, and delay signals d0 and d2 are used in diode pre-driver 806. As illustrated in FIG. 9A, diode pre-driver 806 can include two p-type transistors 902 and 904 coupled in parallel between VDDA and node 910. Two n-type transistors 906 and 908 are coupled in series between node 910 and VSSREG. The signal d0*h* 910 (the delay signal d0 level shifted to voltage levels appropriate for upper pre-driver 702) is coupled to the gates of transistors 902 and 906. The signal inverted d2*h* 912 (the delay signal d2 level shifted to voltage levels appropriate for upper pre-driver 702 and inverted) is coupled to the gates of transistors 904 and 908.

The operation of diode pre-driver 806 is illustrated in FIG. 9B, where waveform 910 represents d0*h*, waveform 912 represents the signal d2*h*, waveform 914 represents the diode enable signal. The voltage at pad 618 is illustrated by waveform 916. As illustrated in FIG. 9B, the diode enable signal transitions from a high to a low on the rising edge of d0$h$ and transitions from low to high on the rising edge of d2$h$.

Consequently, selected ones of diodes 812-1 through 812-L diodes in diode block 808 are engaged during the rising portion of the output voltage to help pull the output voltage to a high value. Consequently, diode block 808 includes L diode blocks 808-1 through 808-L and the diode enable signal can be provided to a subset of the plurality of diode blocks 808-1 through 808-L to counter asymmetrical effects of a termination resistance of the asymmetric termination.

Figure 10:
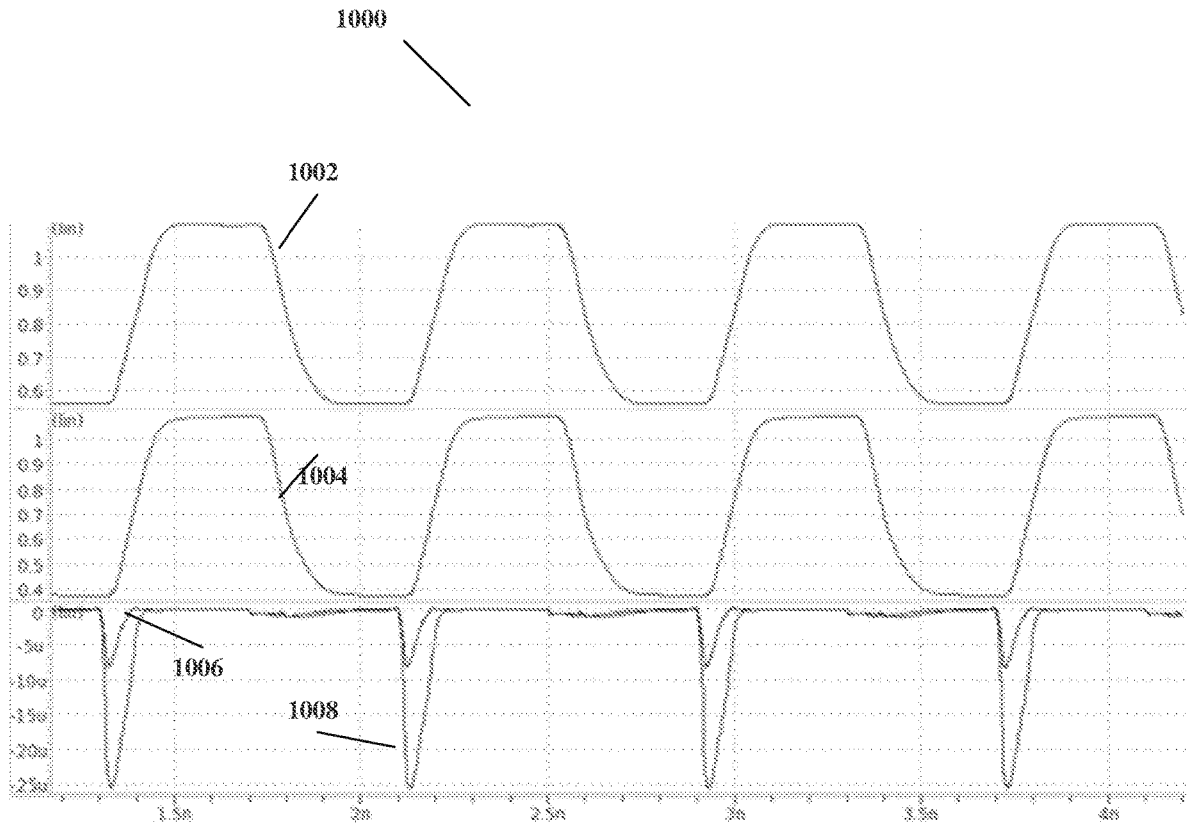
FIG. 10 illustrates output waveforms and current waveforms illustrating operation of the diode driver as illustrated in FIGS. 9A and 9B.

FIG. 10 illustrates simulations of various example waveforms 1000 to demonstrate the operation of driver system 800 as illustrated in FIG. 8. In each of simulation waveforms 1002 and 1004 are with N=9 and Ron=240Ω/9. Waveform 1002 is a waveform at pad 618 for Rtt=50Ω and waveform 1004 is a waveform at pad 618 for Rtt=25Ω. Waveforms 1006 and 1008 represent currents through diode blocks 808 on the rising edges of waveforms 1002 and 1004. As illustrated, driver 800 outputs a symmetrical signal (50% duty cycle) with terminal resistance Rtt variation. Furthermore, the diode size can be programed for different on resistances Ron.

The above detailed description is provided to illustrate specific embodiments of the present invention and is not intended to be limiting. Numerous variations and modifications within the scope of the present invention are possible. The present invention is set forth in the following claims.

What is claimed is:

1. An output driver, comprising:
   a delay generator configured to produce a plurality of delay signals in response to an input signal;
   a pre-driver configured to produce a plurality of control signals based on rising and falling edges of the plurality of delay signals; and
   a main driver configured to couple to a channel with an asymmetric termination and provide an output signal at a node of the main driver based in response to the plurality of control signals,
   wherein the main driver includes a plurality of slices, each slice having a pull-up transistor and a pull-down transistor coupled to the node, the pull-up transistor and pull-down transistor of the plurality of slices being driven by the plurality of control signals,
   wherein the plurality of control signals provides for an asymmetric switching sequence in the plurality of slices to provide an asymmetric response in the main driver in response to the asymmetric termination.

2. The output driver of claim 1, wherein the output voltage is a symmetric signal with matching rising and falling edges based on the asymmetric response.

3. The output driver of claim 1, wherein a spacing between rising and falling edges of the plurality of delay signals is set by slew rate control signals input to the delay generator.

4. The output driver of claim 1, wherein the node of the main driver is the coupled connection between the pull-up transistor and pull-down transistor of each of the plurality is slices, and wherein the plurality of control signals includes a pull-up signal coupled to a gate of the pull-up transistor and a pull-down signal coupled to a gate of the pull-down transistor of each of the plurality of slices.

5. The output driver of claim 4, wherein the plurality of control signals from the pre-driver indicates the asymmetric switching sequence triggered on rising and falling edges of the plurality of delay signals.

6. The output driver of claim 5, wherein the asymmetric switching sequence includes a first sequence for switching the pull-up transistors and the pull-down transistors of the plurality of slices on rising edges of the plurality of delay signals and a second sequence for switching the pull-up transistors and the pull-down transistors of the plurality of slices on falling edges of the plurality of shifted delay signals, wherein the first sequence and the second sequence are different.

7. The output driver of claim 6, wherein the plurality of slices in the main driver includes N slices wherein the N and the switching sequence depend on the on resistance of the main driver in relation with the on resistance of the main driver and the value of a termination resistance of the asymmetric termination.

8. The output driver of claim 6, wherein the plurality of slices includes N slices, the plurality of delay signals includes delay signals d0, d1, d2, and d3, and wherein the switching sequence includes,
   on a rising edge of delay signal d0, a number n0_on_R pull-up transistors of the plurality of slices are turned on and a number n0_off_R pull-down transistors of the plurality of slices are turned off,
   on a rising edge of delay signal d1, a number n1_on_R of additional pull-up transistors of the plurality of slices are turned on and a number n1_off_R of additional pull-down transistors of the plurality of slices are turned off;
   on a rising edge of delay signal d2, a number n2_on_R of additional pull-up transistors of the plurality of slices are turned on and a number n2_off_R of additional pull-down transistors of the plurality of slices are turned off;
   on a rising edge of delay signal d3, a number n3_on_R of additional pull-up transistors of the plurality of slices are turned on and a number n3_off_R of additional pull-down transistors of the plurality of slices are turned off;
   on a falling edge of delay signal d0, a number n0_on_F of pull-down transistors of the plurality of slices are turned on and a number n0_off_F of pull-up transistors of the plurality of slices are turned off;
   on a falling edge of delay signal d1, a number n1_on_F of additional pull-down transistors of the plurality of slices are turned on and a number n1_off_F of additional pull-up transistors of the plurality of slices are turned off;
   on a falling edge of delay signal d2, a number n2_on_F of additional pull-down transistors of the plurality of slices are turned on and a number n2_off_F of additional pull-up transistors of the plurality of slices are turned off;
   on a falling edge of delay signal d3, a number n3_on_F of additional pull-down transistors of the plurality of slices are turned on and a number n3_off_F of additional pull-up transistors of the plurality of slices are turned off,
   wherein the sum of the number n0_on_R, the number n1_on_R, the number n2 on_R, and the number n3 on_R is equal to N,
   wherein the sum of the number n0_off_R, the number n1_off_R, the number n2_off_R, and the number n3_off_R is equal to N,
   wherein the sum of the number n0_on_F, the number n1_on_F, the number n2 on_F, and the number n3_on_F is equal to N, and wherein the sum of the number n0_off_F, the number n1_off_F, the number n2_off_F, and the number n3_off_F is equal to N, and wherein the switching sequence on the rising edge of delay signals d0, d1, d2, and d3 differs from the switching sequence on the falling edge of delay signals d0, d1, d2, and d3.

9. An output driver, comprising:

a delay generator configured to produce a plurality of delay signals in response to an input signal;

a pre-driver configured to produce a plurality of control signals based on the plurality of delay signals; and a main driver configured to couple to a channel with an asymmetric termination and provide an output signal at a node of the main driver based in response to the plurality of control signals, a level shifter that receives the plurality of delay signals and provides shifted delay signals, wherein the plurality of control signals provides for an asymmetric response in the main driver in response to the asymmetric termination, wherein the main driver includes a plurality of slices, each of the plurality of slices including a pull-up transistor coupled in series with a pull-down transistor between system voltage and a ground, wherein the node of the main driver is the coupled connection between the pull-up transistor and pull-down transistor of each of the plurality is slices, and wherein the plurality of control signals includes a pull-up signal coupled to a gate of the pull-up transistor and a pull-down signal coupled to a gate of the pull-down transistor of each of the plurality of slices, wherein the level shifter includes an upper level shifter and a lower level shifter, the upper level shifter configured to shift voltage levels of the plurality of delay signals within a voltage level VDDA and a lower voltage level VSSREG to generate upper delay signals, and the lower level shifter configured to shift voltage levels of the plurality of delay signals within a voltage level VDDREG and a lower voltage VSSA to generate lower delay signals;

wherein the pre-driver includes a plurality of upper-level pre-drivers operating between the voltages VDDA and VSSREG in response to the upper delay signals to provide pull-up signals for each pull-up transistor in the plurality of slices, and a plurality of lower-level pre-drivers operating between the voltages VDDREG and VSSA in response to the lower delay signals to provide pull-down signals for each pull-down transistor in the plurality of slices; and wherein the series coupled pull-up transistor and pull-down transistor of each of the plurality of slices operates between VDD and VSSA.

10. The output driver of claim 9, wherein a first transistor is coupled between the pull-up transistor and the node in each of the plurality of slices and a second transistor is coupled between the node and the pull-down transistor in each of the plurality of slices, each of the first transistor and the second transistor are arranged to be on.

11. The output driver of claim 9, wherein VDDA=1.1V, VSSA=0V, VDDREG=0.875V, and VSSREG-0.225V, wherein voltages in each transistor of the pre-driver and the main driver do not exceed VDDREG, and wherein transistors are core transistors.

12. The output driver of claim 9, further including:

a diode pre-driver configured to provide a diode enable signal in response to a subset of the plurality of delay signals; and a diode block coupled to the node of the main driver, the diode block configured to provide current to the node during a rising edge of the output signal.

13. The output driver of claim 12, wherein the diode pre-driver asserts the diode enable signal on a rising edge of a first delay signal of the plurality of delay signals and removes the diode enable signal on a rising edge of a second delay signal of the plurality of delay signals.

14. The output driver of claim 13, wherein the diode block includes a plurality of diode blocks and wherein the diode enable signal is provided to a subset of the plurality of diode blocks to counter effects of a termination resistance of the asymmetric termination.

15. The output driver of claim 12, further including a level shifter to provide shifted delay signals to the diode pre-driver.

16. A method of driving an output signal in a channel with an asymmetric termination, comprising:

receiving an input signal;

generating, in a delay generator, a plurality of delay signals in response to the input signal;

producing, in a pre-driver, a plurality of control signals based on rising and falling edges of the plurality of delay signals; and providing, in a main driver, an output signal at a node that can be coupled to the channel with the asymmetric termination in response to the plurality of control signals, wherein the main driver includes a plurality of slices, each slice having a pull-up transistor and a pull-down transistor coupled to the node, the pull-up transistor and pull-down transistor of the plurality of slices being driven by the plurality of control signals, wherein the plurality of control signals provides for an asymmetric switching sequence in the plurality of slices to provide an asymmetric response in the main driver in response to the asymmetric termination.

17. The method of claim 16, wherein providing the output voltage includes providing a symmetric signal with matching rising and falling edges based on the asymmetric response.

18. The method of claim 16, wherein generating a plurality of delay signals includes providing a spacing between rising and falling edges of the plurality of delay signals in accordance with slew rate control signals.

19. The method of claim 16, wherein the node of the main driver is the coupled connection between the pull-up transistor and pull-down transistor of each of the plurality is slices, and wherein the plurality of control signals includes a pull-up signal coupled to a gate of the pull-up transistor and a pull-down signal coupled to a gate of the pull-down transistor of each of the plurality of slices.

20. The method of claim 19, wherein the plurality of control signals from the pre-driver indicates the asymmetric switching sequence triggered on rising and falling edges of the plurality of delay signals, and wherein providing the output signal includes executing the switching sequence.

21. The method of claim 20, wherein the asymmetric switching sequence includes a first sequence for switching the pull-up transistors and the pull-down transistors of the plurality of slices on rising edges of the plurality of delay signals and a second sequence for switching the pull-up transistors and the pull-down transistors of the plurality of slices on falling edges of the plurality of shifted delay signals, wherein the first sequence and the second sequence are different.

22. The method of claim 21, wherein the plurality of slices in the main driver includes N slices wherein the N and the switching sequence depend on the on resistance of the main driver in relation with the on resistance of the main driver and the value of a termination resistance of the asymmetric termination.

23. The method of claim 21, wherein the plurality of slices includes N slices, the plurality of delay signals includes delay signals d0, d1, d2, and d3, and wherein the switching sequence includes, on a rising edge of delay signal d0, a number n0_on_R of pull-up transistors of the plurality of slices are turned on and a number n0_off_R of pull-down transistors of the plurality of slices are turned off;

on a rising edge of delay signal d1, a number n1_on_R of additional pull-up transistors of the plurality of slices are turned on and a number n1_off_R of additional pull-down transistors of the plurality of slices are turned off;

on a rising edge of delay signal d2, a number n2_on_R of additional pull-up transistors of the plurality of slices are turned on and a number n2_off_R of additional pull-down transistors of the plurality of slices are turned off;

on a rising edge of delay signal d3, a number n3_on_R of additional pull-up transistors of the plurality of slices are turned on and a number n3_off_R of additional pull-down transistors of the plurality of slices are turned off;

on a falling edge of delay signal d0, a number n0_on_F of pull-down transistors of the plurality of slices are turned on and a number n0_off_F of pull-up transistors of the plurality of slices are turned off;

on a falling edge of delay signal d1, a number n1_on_F of additional pull-down transistors of the plurality of slices are turned on and a number n1_off_F of additional pull-up transistors of the plurality of slices are turned off, on a falling edge of delay signal d2, a number n2_on_F of additional pull-down transistors of the plurality of slices are turned on and a number n2_off_F of additional pull-up transistors of the plurality of slices are turned off;

on a falling edge of delay signal d3, a number n3_on_F of additional pull-down transistors of the plurality of slices are turned on and a number n3_off_F of additional pull-up transistors of the plurality of slices are turned off, wherein a sum of the number n0_on_R, the number n1_on_R, the number n2 on_R, and the number n3_on_R is equal to N, wherein a sum of the number n0_off_R, the number n1_off_R, the number n2_off_R, and the number n3_off_R is equal to N, wherein a sum of the number n0_on_F, the number n1_on_F, the number n2_on_F, and the number n3_on_F is equal to N, and wherein a sum of the number n0_off_F, the number n1_off_F, the number n2_off_F, and the number n3_off_F is equal to N, and wherein the switching sequence on the rising edge of delay signals d0, d1, d2, and d3 differs from the switching sequence on the falling edge of delay signals d0, d1, d2, and d3.

24. A method of driving an output signal in a channel with an asymmetric termination, comprising:

receiving an input signal;

generating, in a delay generator, a plurality of delay signals in response to the input signal;

producing, in a pre-driver, a plurality of control signals based on the plurality of delay signals; and providing, in a main driver, an output signal at a node that can be coupled to the channel with the asymmetric termination in response to the plurality of control signals, wherein the plurality of control signals provides for an asymmetric response in the main driver in response to the asymmetric termination, wherein the main driver includes a plurality of slices, each of the plurality of slices including a pull-up transistor coupled in series with a pull-down transistor between system voltage and a ground, wherein the node of the main driver is the coupled connection between the pull-up transistor and pull-down transistor of each of the plurality is slices, and wherein the plurality of control signals includes a pull-up signal coupled to a gate of the pull-up transistor and a pull-down signal coupled to a gate of the pull-down transistor of each of the plurality of slices;

level shifting, in an upper level shifter, the plurality of delay signals to be within a voltage level VDDA and a lower voltage level VSSREG to generate upper delay signals;

level shifting, in a lower level shifter, the plurality of delay signals to be within a voltage level VDDREG and a lower voltage VSSA to generate lower delay signals;

producing, in a plurality of upper-level pre-drivers operating between the voltages VDDA and VSSREG, pull-up signals in response to the upper delay signals for each pull-up transistor in the plurality of slices;

producing, in a plurality of lower-level pre-drivers operating between the voltages VDDREG and VSSA, pull-down signals in response to the lower delay signals for each pull-down transistor in the plurality of slices; and wherein the series coupled pull-up transistor and pull-down transistor of each of the plurality of slices operates between VDD and VSSA.

25. The method of claim 24, further including protecting each of the plurality of pull-up transistors and the plurality of pull-down transistors with a first transistor coupled between the pull-up transistor and the node in each of the plurality of slices and a second transistor coupled between the node and the pull-down transistor in each of the plurality of slices, each of the first transistor and the second transistor being on.

26. The method of claim 24, wherein VDDA=1.1V, VSSA=0V, VDDREG-0.875V, and VSSREG-0.225V, and wherein voltages in each transistor of the pre-driver and the main driver do not exceed VDDREG.

27. The method of claim 24, further including:

providing, in a diode pre-driver, a diode enable signal in response to a subset of the plurality of delay signals; and providing, in a diode block coupled to the node of the main driver, a current to the node during a rising edge of the output signal.

28. The method of claim 27, wherein providing the diode enable signal includes asserting the diode enable signal on a rising edge of a first delay signal of the plurality of shifted delay signals; and removing the diode enable signal on a rising edge of a second delay signal of the plurality of delay signals.

29. The method of claim 28, wherein the diode block includes a plurality of diode blocks and wherein the diode enable signal is provided to a subset of the plurality of diode blocks to counter effects of a termination resistance of the asymmetric termination.

30. The method of claim 27, further including level shifting the plurality of delay signals provided to the diode pre-driver.

31. An output driver, comprising:

a delay generator configured to produce a plurality of delay signals in response to an input signal;

a pre-driver configured to produce a plurality of control signals based on the plurality of delay signals;

a main driver configured to couple to a channel with an asymmetric termination and provide an output signal at a node of the main driver based in response to the plurality of control signals;

a diode pre-driver configured to provide a diode enable signal in response to a subset of the plurality of delay signals; and a diode block coupled to the node of the main driver, the diode block configured to provide current to the node during a rising edge of the output signal, wherein the plurality of control signals provides for an asymmetric response in the main driver in response to the asymmetric termination.

32. The output driver of claim 31, wherein the diode pre-driver asserts the diode enable signal on a rising edge of a first delay signal of the plurality of delay signals and removes the diode enable signal on a rising edge of a second delay signal of the plurality of delay signals.

33. The output driver of claim 32, wherein the diode block includes a plurality of diode blocks and wherein the diode enable signal is provided to a subset of the plurality of diode blocks to counter effects of a termination resistance of the asymmetric termination.

34. The output driver of claim 31, further including a level shifter to provide shifted delay signals to the diode pre-driver.

35. The output driver of claim 1, further including:

a diode pre-driver configured to provide a diode enable signal in response to a subset of the plurality of delay signals; and a diode block coupled to the node of the main driver, the diode block configured to provide current to the node during a rising edge of the output signal.

36. A method of driving an output signal in a channel with an asymmetric termination, comprising:

receiving an input signal;

generating, in a delay generator, a plurality of delay signals in response to the input signal;

producing, in a pre-driver, a plurality of control signals based on the plurality of delay signals; and providing, in a main driver, an output signal at a node that can be coupled to the channel with the asymmetric termination in response to the plurality of control signals, wherein the plurality of control signals provides for an asymmetric switching sequence in the plurality of slices to provide an asymmetric response in the main driver in response to the asymmetric termination;

providing, in a diode pre-driver, a diode enable signal in response to a subset of the plurality of delay signals; and providing, in a diode block coupled to the node of the main driver, a current to the node during a rising edge of the output signal.

37. The method of claim 36, wherein providing the diode enable signal includes asserting the diode enable signal on a rising edge of a first delay signal of the plurality of shifted delay signals; and removing the diode enable signal on a rising edge of a second delay signal of the plurality of delay signals.

38. The method of claim 37, wherein the diode block includes a plurality of diode blocks and wherein the diode enable signal is provided to a subset of the plurality of diode blocks to counter effects of a termination resistance of the asymmetric termination.

39. The method of claim 37, further including level shifting the plurality of delay signals provided to the diode pre-driver.

40. The method of claim 16, further including:

providing, in a diode pre-driver, a diode enable signal in response to a subset of the plurality of delay signals; and providing, in a diode block coupled to the node of the main driver, a current to the node during a rising edge of the output signal.

* * * * *